United States Patent [19]

Goto

[11] Patent Number: 4,761,678
[45] Date of Patent: Aug. 2, 1988

[54] INTEGRATED CIRCUIT SEMICONDUCTOR DEVICE

[75] Inventor: Hideto Goto, Tokyo, Japan

[73] Assignee: NEC Corporation, Tokyo, Japan

[21] Appl. No.: 19,281

[22] Filed: Feb. 26, 1987

[30] Foreign Application Priority Data

Feb. 26, 1986 [JP] Japan .................................. 61-41065

[51] Int. Cl.[4] ...................... H01L 29/78; H01L 27/02; H01L 29/34
[52] U.S. Cl. .................................. 357/23.6; 357/23.8; 357/54; 357/51; 357/41
[58] Field of Search .................... 357/23.6, 23.8, 54, 357/51, 41

[56] References Cited

U.S. PATENT DOCUMENTS

| | | | |
|---|---|---|---|
| 4,335,505 | 6/1982 | Shibata et al. | 357/54 |
| 4,343,657 | 8/1982 | Ito et al. | 357/23.6 |
| 4,511,911 | 4/1985 | Kenney | 357/23.6 |
| 4,603,059 | 7/1986 | Kiyosumi et al. | 357/54 |
| 4,621,277 | 11/1986 | Ito et al. | 357/23.6 |
| 4,622,570 | 11/1986 | Taguchi | 357/23.6 |
| 4,672,409 | 6/1987 | Takei et al. | 357/54 |

FOREIGN PATENT DOCUMENTS 55-88368  7/1980  Japan .................................. 357/23.6

OTHER PUBLICATIONS

IBM Tech. Disclo. Bull., vol. 26, No. 5, 10/83, Chao et al.

Primary Examiner—Martin H. Edlow
Assistant Examiner—D. Featherstone
Attorney, Agent, or Firm—Sughrue, Mion, Zinn, Macpeak & Seas

[57] ABSTRACT

An integrated circuit semiconductor device in which a first insulating layer including a silicon nitride film and a second insulating layer including a silicon oxide film thermally grown are formed on a major surface of a silicon substrate and contacted each other at respective side edges to form a boundary is disclosed. First and second electrodes are formed on the first and second insulating layers, respectively and separated each other with a gap. A third insulating layer fills the gap and contacts to both of peripheral surface sections of the first and second insulating layers extending from the boundary, respectively.

5 Claims, 4 Drawing Sheets

INTEGRATED CIRCUIT SEMICONDUCTOR DEVICE

BACKGROUND OF THE INVENTION

The present invention relates to an integrated circuit semiconductor device and more particularly, to a dynamic memory device having a plurality of memory cells each of which is constituted by a single transistor and a single capacitor coupled to the transistor.

A silicon nitride layer or a composite layer including a silicon nitride film and a silicon oxide film is used as a dielectric film of a MOS type capacitor because the silicon nitride has the high dielectric constant. On the other hand, a gate insulating film of an insulated gate field effect transistor (hereinafter abbreviated as IGFET) is made of thermally grown silicon oxide ($SiO_2$) because of its highly reliable nature. However, in the prior art, that is, concave is inevitably caused in the silicon oxide film thermally grown as the gate insulating film of IGFET in the vicinity of the boundary between the silicon oxide film and the silicon nitride film as the dielectric film of the capacitor. Therefore, even if the silicon oxide film is constructed such that it extends along the bottom of the silicon nitride film at a distance of 150 Å to 300 Å (angstrom) from the boundary, that is, from the edge of the silicon nitride film, the breakdown voltage between the gate electrode and the substrate becomes about 15 V which is lower value than a desirable value of 30 V when the silicon oxide film has the thickness of 400 Å.

SUMMARY OF THE INVENTION

One object of the invention is to provide an integrated circuit semiconductor device in which any notch mentioned above is not caused at a boundary between two kinds of insulating films, that is, between the silicon oxide film and the silicon nitride film and the breakdown voltage can be enhanced.

Another object of the invention is to provide a dynamic memory device in which the breakdown voltage between the gate electrode formed on the thermally gorwn silicon oxide film as the gate insulating film and the silicon substrate.

According to a feature of the present invention, there is provided an integrated circuit semiconductor device comprises a first insulating layer selectively formed on a semiconductor substrate, and having an upper surface, a bottom and a side edge, the first insulating layer including a silicon nitride film, and a second insulating layer selectively formed on the semiconductor substrate, abutted against the side edge of the first insulating layer to form a boundary therebetween and against a part of the bottom of the first insulating layer. The second insulating layer has an upper surface including a peripheral part extending from the boundary. A first electrode selectively is formed on the upper surface of the first insulating layer except a peripheral section of the upper surface of the first insulating layer extending from the boundary. A third insulating layer covers the first electrode and contacts to the peripheral section of the upper surface of the first insulating layer, an upper end of the boundary and the peripheral part of the upper surface of the second insulating layer, continuously, and a second electrode is formed on the upper surface of the second insulating layer and on a part of the third insulating layer. Preferably, the peripheral part of the upper surface of the second insulating layer to which the third insulating layer is contacted has the length of 300 to 600 Å (angstrom) because when the length is 300 Å or more, the unfavorable reduction of the breakdown voltage is not caused. On the other hand, when the length is 600 Å or less, the surface of the substrate, that is, the surface of the channel region of the IGFET is not damaged during an etching process in the fabrication of the device. The first insulating layer may be a single silicon nitrode film, or a composite layer constituted by a silicon oxide film and a silicon nitride film, or else, constituted by a first silicon oxide film, a silicon nitride film on the first silicon oxide film and a second silicon oxide film on the silicon nitride film. Preferably, the second insulating layer is made of a silicon oxide film by thermal oxidation of the silicon substrate, and has the thickness of twice the thickness of the first insulating layer or more. The first insulating layer and the first electrode may be a dielectric film and an upper electroce of a MOS type capacitor of a dynamic memory cell, respectively, and the second insulating layer and the second electrode may be a gate insulating layer and a gate electrode of IGFET of the dynamic memory cell, respectively.

DESCRIPTION OF THE EMBODIMENT

Figure 1:
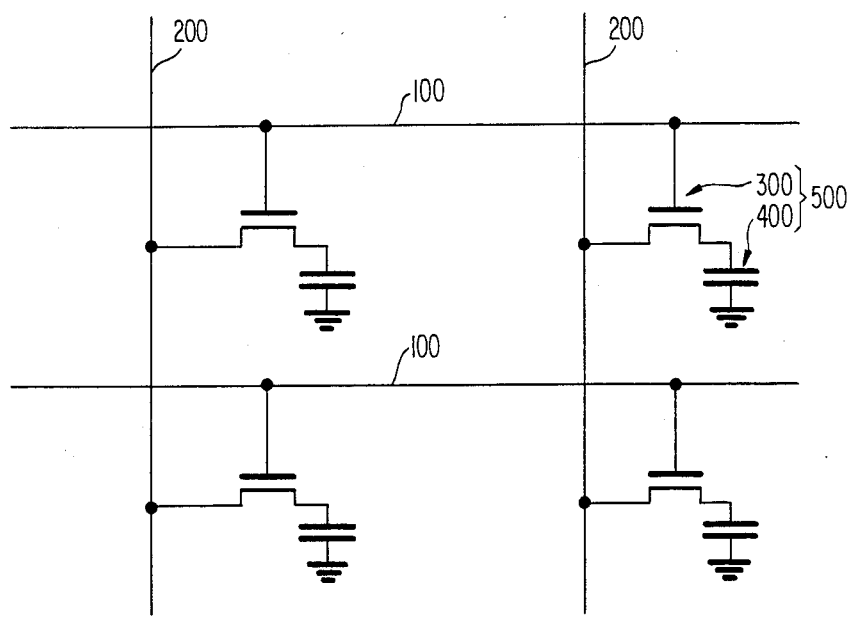
FIG. 1 is a circuit diagram of conventional dynamic memory cells in a dynamic memory device.

Referring to FIG. 1, a plurality of word lines 100 and a plurality of bit lines 200 extend, and at the respective crossing positions of the word lines and the bit lines, dynamic memory cells 500 are connected to these lines. Each of memory cells comprises a transfer gate IGFET 300 and a capacitor 400 coupled to the IGFET 300. The channel region of the IGFET may be directly coupled to the capacitor such that the gate insulating film made of thermally grown silicon oxide of IGFET is contacted to the dielectric film made of silicon nitride of the capacitor.

Figure 2:
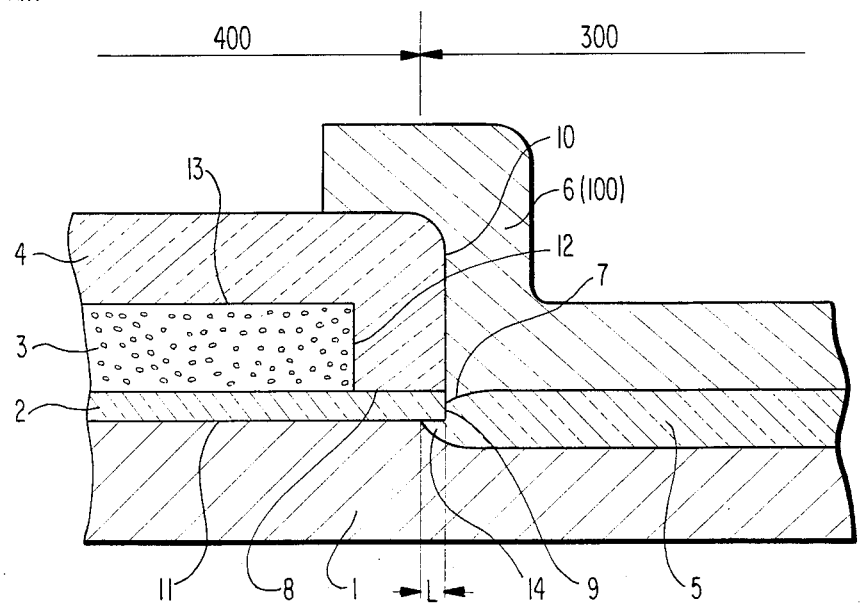
FIG. 2 is a cross-sectional view showing a part of the dynamic memory cell in the prior art.

Referring to FIG. 2, a silicon nitride layer 2 of 250 Å thickness as a dielectric film of the capacitor 400 is selectively formed on a major surface of a P-type silicon substrate 1, and an upper electrode 3 made of doped polycrystalline silicon and having the thickness of 3000 Å is provided on the silicon nitride layer 2 except a peripheral portion 8 thereof. An insulating layer 4 converted from the polycrystalline silicon and having the thickness of 2000 Å is formed on the upper and side surfaces 13, 12 of the upper electrode 3 and on the peripheral portion 8 of the silicon nitride layer 2 such that the side surface 10 of the insulating layer 4 coincides with the side edge 9 of the silicon nitride layer 2. Thereafter, a silicon oxide layer 5 as the gate insulating film of IGFET 300 having the thickness of 500 Å is thermally gorwn such that a part 14 of the silicon oxide layer 5 extends along the bottom 11 of the silicon nitride layer 2 at a distance L of 200 Å. A neck 7 is formed in the silicon oxide layer 5 at the boundary between the silicon nitride layer 2 and the silicon oxide layer 5. A gate electrode 6 which is made of doped polycrystalline silicon and a part of the word line 100 is formed on the gate insulating film 5 and on the insulating layer 4 to overlap the side section of the upper electrode 3. In the memory device of the prior art, the breakdown voltage between the gate electrode 6 and the silicon substrate 1 becomes low value, for example, of 15 V, which is about a half of the desirable value, for example, of 30 V when the gate insulating film has the 400 Å thickness.

Figure 3:
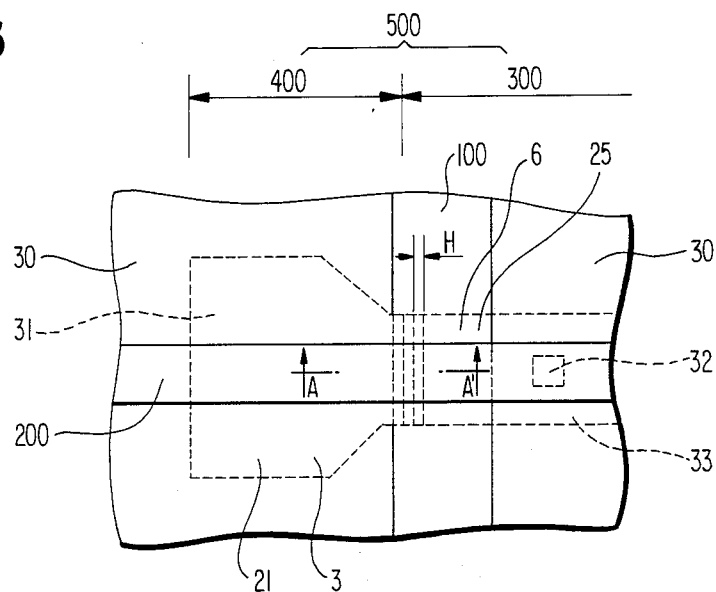
FIG. 3 is a plan view showing an embodiment of the present invention.
Figure 4:
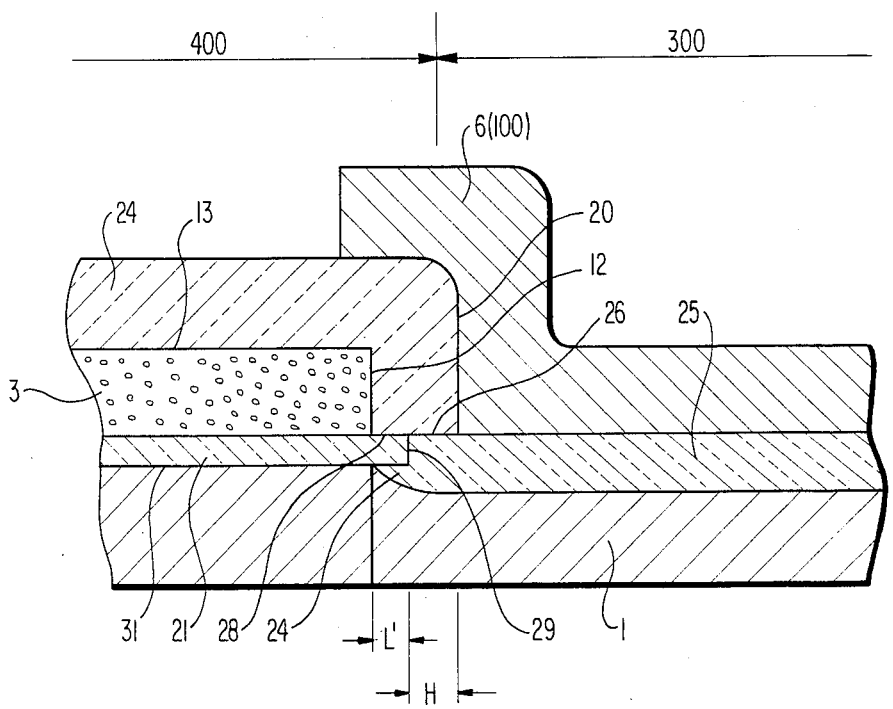
FIG. 4 is an enlarged cross-sectional view taken along line A—A' in FIG. 3 as viewed in the direction of arrows.

Referring to FIGS. 3 and 4, a dynamic memory cell 500 of an embodiment of the present invention will be explained. In these Figures, the same components as those in FIGS. 1 and 2 are indicated by the same reference numerals. In an active region 31 of the silicon substrate 1 surrounded by an field insulating layer 30, the capacitor 400 and the IGFET 300 are formed. The bit line of aluminum 200 is connected to an N-type impurity region 33 serving as the source or drain region of the IGFET through contact hole 32 formed in an intermediate insulator layer (not shown). A dielectric film 21 of the capacitor 400 is provided on the major surface of the P-type silicon substrate 1. The dielectric film 21 of 250 Å thickness may be a silicon nitride layer, or a composite film of a silicon oxide layer and a silicon nitride layer formed on the silicon oxide layer, or else a composite film of a first silicon oxide layer, a silicon nitride layer on the first silicon oxide layer and a second silicon oxide layer on the silicon nitride layer. The upper electrode 3 of doped polycrstalline silicon having the thickness of 3000 Å is provided on the dielectric film. An insulating layer 24 converted from the polycrystalline silicon and having the thickness of 2000 Å is formed on the upper and side surfaces 13, 12 of the upper electrode 3 and on the peripheral section 28 of the upper surface of the dielectric film 21. The side surface 20 of the insulating layer 24 does not coincides with the edge 29 of the dielectric film 21. That is, the edge 29 of the dielectric film 21 recedes from the side surface 20 of the insulating layer 24 at a length H of 300 to 600 Å. A silicon oxide layer 25 of 300 to 600 Å thickness as the gate insulating film of IGFET, for example, the thickness of 550 Å is thermally grown on the major surface of the silicon substrate, that is, on the channel region of the IGFET. In the present invention, a peripheral part 26 of the upper surface of the gate insulating film 25 is contacted to the insulating layer 24 over the whole length H. Further, the gate insulating film 25 is abutted against the side edge 29 of the dielectric film 21, and a part 24 of the gate insulating film 21 is abutted against the bottom 31 of the dielectric film 21 at a length L' of 150 Å to 300 Å. According to the relation between the side edge 29 of the dielectric film 21 and the side surface 20 of the insulating layer 24, no neck is produced in the gate insulating film 25 of thermal silicon oxide. Therefore, the structure mentioned above can maintain a high breakdown voltage, for example, of 30 V between the gate electrode 6 and the silicon substrate 1.

Figure 5A:
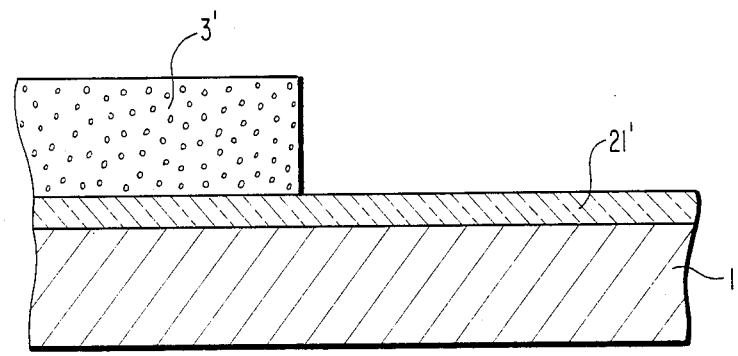
FIGS. 5A to 5D are cross-sectional views showing the process of a part of manufacturing the embodiment.
Figure 5B:
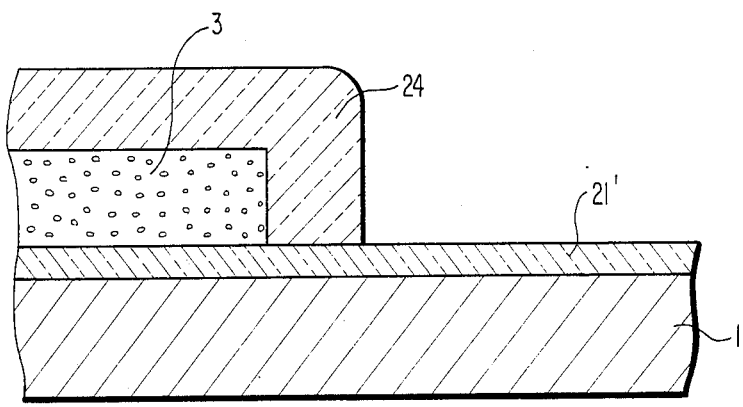
Figure 5C:
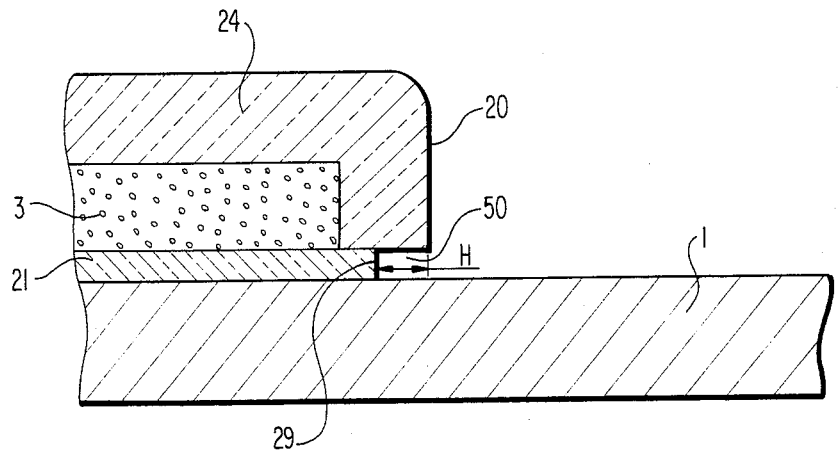
Figure 5D:
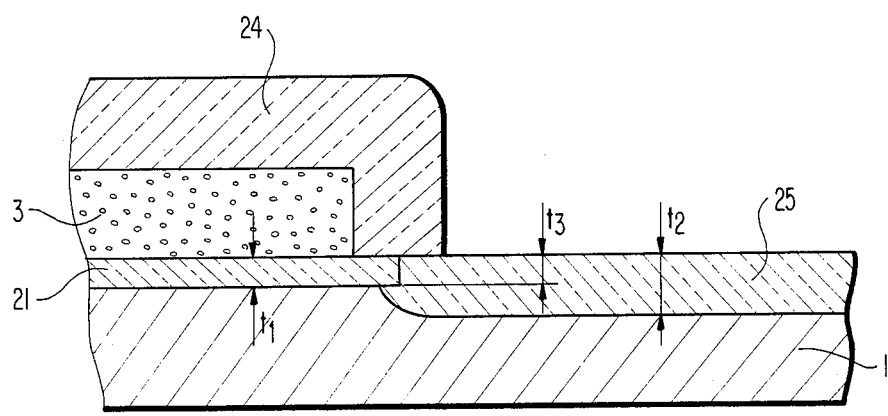

Referring to FIGS. 5A to 5D, a method of manufacturing the embodiment shown in FIG. 4 is disclosed. First, as shown in FIG. 5A, a silicon nitride film 21' is formed over the surface of the silicon substrate 1 and of the field insulating layer 30 (FIG. 3). The thickness of the film 21' ranges from 150 to 300 Å. Thereafter, an electrode 3' of doped polycrystalline silicon having the thickness of 4000 Å is selectively formed on the silicon nitride film 21'. The film 21' may be a composite layer constituted by a silicon oxide film and a silicon nitride film on the silicon oxide film, or by a first silicon oxide film, a silicon nitride film on the first silicon oxide film and a second silicon oxide film on the silicon nitride film. Next, as shown in FIG. 5B, an insulating layer 24 having the thickness of 1000 to 2500 Å, for example, 2000 Å is formed so as to cover the electrode 3 by a heat treatment carried out in an oxidizing atomosphere. The second insulating layer 24 is a silicon oxide layer converted from the surface portion of the polycrystalline silicon pattern 3'. Next, as shown in FIG. 5C, with the electrode 3 and the insulating layer 24 employed as a mask, the film 21' is selectively removed by anisotropic reactive ion etching method to expose the sections of the surface of the substrate above which the mask member does not exist. Thereafter, the dielectric film 21 is further etched so that the side edge 29 thereof is located at a position inner than the side surface 20 of the insulating layer 24 by carrying out isotropic etching method, e.g., a wet etching method using a high-temperature hot phosphoric acid, for a sufficiently long period of time. By this process, an air gap 50 is formed under the bottom surface of the insulating layer 24 so that the length H of the gap 50 becomes 300 to 600 Å. Then, the remain portion of the film 21' is used as the dielectric film 21 of the capacitor 400. Thereafter, a heat treatment is carried out in an oxidizing atmosphere to form the gate insulating film 25. At this time, when the thickness $t_2$ of the gate insulating film 25 is sufficiently greater than the thickness $t_1$ of the dielectric film 21, the gap 50 is filled with the gate insulating film 25. Therefore, the gate insulating film 25 is completely connected to the insulating layer 24 and the dielectric film 21 as shown in FIG. 5D. Subsequently, as shown in FIG. 4, the gate electrode 6 is formed over the gate insulating film 25 and on a part of the insulating layer 24 to complete the dynamic memory cell.

It is known that, when a silicon oxide film is formed by oxidizing a silicon substrate, about one half of its overall thickness is above the original surface of the silicon substrate. Assuming that, as shown in FIG. 5D, the thickness of the gate insulating film 25 is represented by $t_2$; the thickness of a portion of the gate insulating film 25 which is grown above the original surface of the semiconductor substrate 1 is represented by $t_3$; and the thickness of the dielectric film 21 (i.e., the height of the air gap 50) is represented by $t_1$, then it is necessary, in order to allow the gate insulating film 25 to connect to the insulator layer 24 by completing filling the gap 50, to meet the following condition:

$$t_1 \leq t_3 = \tfrac{1}{2} \times t_2$$

i.e., $$2 \times t_1 \leq t_2$$

In other words, when the thickness of the gate insulating film 25 is greater than a value twice the thickness of the dielectric film 21, the insulating layer 24 and the gate insulating film 25 are completely connected together, and the breakdown voltage of the gate electrode 6 is thereby improved.

Returning to FIG. 4, since the gate insulating film 25 is completely connected to the insulating layer 24 at the boundary between the side edge 29 of the dielectric film 21 and the gate insulating film 25, there is no reduction in thickness of the gate insulating film 25 at the boundary. Accordingly, there is no lowering in the dielectric strength between the gate electrode 6 and the semiconductor substrate 1. Although the dielectric insulating film 21, which is handly oxidizable, is readily strained during an oxidizing heat treatment, since the connection between the dielectric insulating film 21 and the gate electrode 6 is completely cut off, it is possible to prevent lowering of the dielectric strength from this point of view also.

As has been described above, it is possible, according to the semiconductor device of the present invention, to prevent lowering in the dielectric strength between the semiconductor substrate 1 and the gate electrode 6 and thereby improve the production yield.

What is claimed is:

1. An integrated circuit semiconductor device comprising a first insulating layer selectively formed on a semiconductor substrate, and having an upper surface, a bottom and a side edge, said first insulating layer including a silicon nitride film, a second insulating layer selectively formed on said semiconductor substrate, abutted against said side edge of said first insulating layer to form a boundary therebetween and against a part of said bottom of said first insulating layer, said second insulating layer having an upper surface including a peripheral part extending from said boundary, a first electrode selectively formed on said upper surface of said first insulating layer except a peripheral section of said upper surface of said first insulating layer extending from said boundary, a third insulating layer covering said first electrode and contacted to said peripheral section of said upper surface of said first insulating layer, an upper end of said boundary and said peripheral part of said upper surface of said second insulating layer, continuously, and a second electrode formed on said upper surface of said second insulating layer and covering a part of said third insulating layer.

2. A semiconductor device of claim 1, in which said peripheral part of said second insulating layer to which said third insulating layer is contacted has the length of 300 to 600 angstroms.

3. A semiconductor device of claim 1, in which said second insulating layer is made of silicon oxide.

4. A semiconductor device of claim 1, in which the thickness of said second insulating layer is greater than a value twice the thickness of said first insulating layer.

5. A dynamic memory device having a plurality of dynamic memory cells on a silicon substrate, each of said memory cells comprising a dielectric film of a capacitor formed on the surface of said substrate and having a peripheral surface section, said dielectric film including a silicon nitride film, an upper electrode of said capacitor made of polycrystalline silicon formed on a predetermined surface area of said dielectric film except said peripheral surface section, a gate insulating film of a transistor formed on the surface of said substrate such that said gate insulating film is abutted against the side edge of said dielectric film and a part of the bottom of said dielectric film, said gate insulating film being made of thermally grown silicon oxide, an insulating layer covering said upper electrode of said capacitor and contacted to said peripheral surface section of said dielectric film and a peripheral surface part of said gate insulating film continuously, and a gate electrode of said transistor formed on said gate insulating film and on a part of said insulating layer.

* * * * *